US007569975B2

(12) United States Patent
Nye et al.

(10) Patent No.: US 7,569,975 B2
(45) Date of Patent: Aug. 4, 2009

(54) CABLE DIRECT INTERCONNECTION (CDI) METHOD FOR PHASED ARRAY TRANSDUCERS

(75) Inventors: Les Nye, Dauphin, PA (US); Adam Liberatore, Kuruman (ZA); Kirk Rager, Reedsville, PA (US); Jason Toomey, Linwood, MA (US)

(73) Assignee: Olympus NDT, Waltham, MA (US)

( * ) Notice: Subject to any disclaimer, the term of this patent is extended or adjusted under 35 U.S.C. 154(b) by 54 days.

(21) Appl. No.: 11/557,181

(22) Filed: Nov. 7, 2006

(65) Prior Publication Data

US 2008/0129152 A1 Jun. 5, 2008

(51) Int. Cl.
*H01L 41/08* (2006.01)

(52) U.S. Cl. ...................................... 310/334; 310/326

(58) Field of Classification Search ................ 310/326, 310/327, 334–337

See application file for complete search history.

(56) References Cited

U.S. PATENT DOCUMENTS 5,648,942 A 7/1997 Kunkel, III
6,894,425 B1 5/2005 Solomon et al.
2005/0020918 A1 1/2005 Wilk et al.
2006/0132123 A1 6/2006 Wang et al.
2006/0229594 A1 10/2006 Francischelli et al.

OTHER PUBLICATIONS

Search Report issued by PCT Office on Feb. 8, 2008 in connection with corresponding application No. PCT/US 06/46794.
Written Opinion issued by PCT Office on May 22, 2009 in connection with corresponding application No. PCT/US2006/o46794.

*Primary Examiner*—Mark Budd
(74) *Attorney, Agent, or Firm*—Ostrolenk, Faber, LLP

(57) ABSTRACT

A solderless, direct cable interconnect for an array transducer and method for the fabrication thereof. An ultrasonic array transducer includes an acoustic backing layer, a piezoelectric layer containing an array of piezoelectric elements (typically created from a solid layer of piezoelectric material disposed over a matching layer cut with a dicing saw and fixed on a solid ground plane), and plurality of control wires, disposed between the backing layer and the piezoelectric layer. A solid backing material which will displace slightly at temperature and pressure is formed into the desired shape. Kerfs are precisely cut into the shaped backing material in a pattern such that they will line up with the center of each piezoelectric element in the piezoelectric layer. Signal wires are disposed across the backing material along the kerfs, and the piezoelectric layer is aligned and then compression bonded to the backing layer, encapsulating the signal wires and electrically connecting them to the piezoelectric elements without the need for an intermediate connection board or flex circuit.

10 Claims, 12 Drawing Sheets

CABLE DIRECT INTERCONNECTION (CDI) METHOD FOR PHASED ARRAY TRANSDUCERS

BACKGROUND OF THE DISCLOSURE

The present disclosure relates to transducer arrays, comprising at least one transducer element, and more particularly, to a method of aligning and electrically connecting signal wires directly to the individual transducer elements. The present disclosure provides for signal wires to be attached to the individual transducer elements without the need for a custom built, costly flex circuit, soldering of signal wires to or near the elements, or the use of a poured backing.

DESCRIPTION OF RELATED ART

Any discussion of the related art throughout the specification should in no way be considered as an admission that such art is widely known or forms part of common general knowledge in the field.

Ultrasonic transducers are devices that convert electrical energy to mechanical energy, or vice versa. An electric potential is created across a piezoelectric element, exciting the element at a frequency corresponding to the applied voltage. As a result, the piezoelectric element emits an ultrasonic beam of acoustic energy which can be coupled into a material under test. Conversely, when an acoustic wave, an echo of the original ultrasonic beam for example, strikes the piezoelectric element, the element will produce a corresponding voltage across its electrodes.

A common application for ultrasonic transducers is in ultrasonic imaging, which is used, for example, in non-destructive testing. Frequently in these applications, arrays of transducers will be constructed and uniformly arranged along a straight or curvilinear axis or in a two dimensional grid. The transducer array will be constructed such that each transducer element can be energized independently by some remote control circuitry. In this way, control circuitry can be devised to excite the transducer array in such a way as to shape and steer the acoustic wave (typically referred to as beam forming) to facilitate imaging of the internal structure of a test piece. Beam forming techniques of this type should be well-known to those familiar with the art.

A transducer construction of this type requires a plurality of conductors to be electrically connected to the first side of each piezoelectric element (this is typically the side adjacent to the backing material) and a return path (typically taking the form of a common ground plane disposed on top of the piezoelectric elements) to be connected to the second side of each piezoelectric element, often through one or more acoustic matching layers. As the overall transducer geometry decreases in size and the number of elements in the array increases, it becomes increasingly difficult to align and make these electrical connections.

The vast majority of array transducers are typically built using an intermediate board or a flex circuit to electrically connect the signal wires from the control circuitry to the individual piezoelectric elements. An approach disclosed in U.S. Pat. No. 6,894,425 includes such a method, fabricating a flexible circuit and disposing it between the backing and piezoelectric layers. Unfortunately, the design and fabrication of such a flexible circuit is costly and time consuming. In addition, circuit layers of this type, flexible or not, require soldering directly to the piezoelectric elements to ensure good acoustic matching. This soldering process can cause the piezoelectric elements to experience significant heating, which can possibly depolarize or otherwise damage the structure of the piezoelectric material. Further, the circuit elements in the intermediate boards or flex circuits typically result in a large contact area with the piezoelectric elements, impeding acoustic performance of the elements. An intermediate circuit, flexible or not, also increases the complexity of the transducer assembly with the number of intermediate connections required between the remote control circuitry and the piezoelectric elements.

An approach disclosed in U.S. Pat. No. 5,592,730 and another disclosed in U.S. Pat. No. 5,559,388, both present methods of creating conductive vias (conductive columns arranged orthogonally, along the z-axis, to the plane of the transducer array) through the backing material. While these methods are effective, they are also complex and time consuming to produce and require the use of a poured backing, which can distort due to shrinking during the curing process, negatively affecting acoustic performance. Further, as these z-axis connection methods still represent an intermediate electrical connection and require soldering relatively near the piezoelectric material, they do little to improve the issue of overheating applied to the piezoelectric material by using a flex circuit or other type of intermediate board.

In addition, methods for creating flex circuits or conductive vias through the backing material typically require a significant initial investment and setup time. While the additional cost and effort associated with these methods may be acceptable for large runs of mass produced standard transducer assemblies, they can significantly reduce the cost effectiveness and increase the design time of small runs of custom, application specific transducer assemblies.

Accordingly, it would be advantageous to provide an alignment and electrical connection method between the piezoelectric elements and the control circuitry which is reliable, simple, and elegant to manufacture. It would also be advantageous if this new method eliminated the need for high temperature soldering on or near the piezoelectric elements. Further, it would be advantageous if this new method significantly reduced the contact area required by existing methods to secure electrical connections to the piezoelectric elements. It would also be advantageous if this new method significantly reduced the number of intermediate connections required between the control circuitry and the piezoelectric elements. It would also be advantageous if this new method provided a cost effective and timely means to fabricate custom, application specific transducer assemblies.

SUMMARY OF THE DISCLOSURE

It is an object of the present disclosure to overcome the problems associated with prior art. The present disclosure does this by scribing a pattern of kerfs into the solid backing material. These kerfs are precisely and reliably made (with the use of a dicing saw, for example, though other methods may be used), and are used to precisely align the signal wires directly with the individual piezoelectric elements. A thin layer of adhesive is used to compression bond the piezoelectric layer to the backing layer with the aligned signal wires in place. The backing layer is constructed of a material specially selected to displace slightly with temperature and pressure. As a result, during the compression bonding process, the signal wires are encapsulated between the backing and piezoelectric layers, creating a direct electrical connection between the piezoelectric elements and the remote control circuitry and eliminating the need for any intermediate circuit connections.

It is the objective of the present disclosure to provide a method for precisely and reliably aligning signal wires directly with the individual piezoelectric elements within the transducer array, without the need for an intermediate circuit or a soldering process on or near the piezoelectric elements. It is the further objective of the present disclosure to use a solid, compliant backing which is not poured or cast in place. It is still another objective of the present disclosure to minimize the electrical contact area required against the piezoelectric elements.

In the preferred embodiment of the present disclosure, a linear ID transducer array is constructed using a comb pattern of kerfs along a flat backing.

Other features and advantages of the present disclosure will become apparent from the following description that refers to the accompanying drawings.

DETAILED DESCRIPTION OF EMBODIMENTS OF THE DISCLOSURE

Although the present disclosure has been described in relation to particular embodiments thereof, many other variations and modifications and other uses will become apparent to those skilled in the art. It is preferred, therefore, that the present disclosure not be limited by the specific disclosure herein.

FIG. 1 through FIG. 5 illustrate the preferred embodiment of the present disclosure. These figures illustrate the method of the present disclosure to directly connect, without the use of an intermediate circuit (either through the backing material or as a separate layer) or a poured backing, the electronic control circuitry to the individual piezoelectric elements.

Although the following discussion of the present disclosure speaks specifically to piezoelectric array transducers, the present disclosure is not limited in this regard. The methods of the present disclosure are applicable to any type of transducer, including, but not limited to, piezoelectric and eddy current. Accordingly, the methods of the present disclosure are also applicable to single element transducer assemblies as well.

Although the following discussion of the present disclosure speaks specifically to the use of kerfs to align and secure signal wires, the present disclosure is not limited in this regard. The inventors also contemplate other methods to align and secure the signal wires including but not limited to: alignment fixtures, wire frames, and epoxy.

Figure 1:
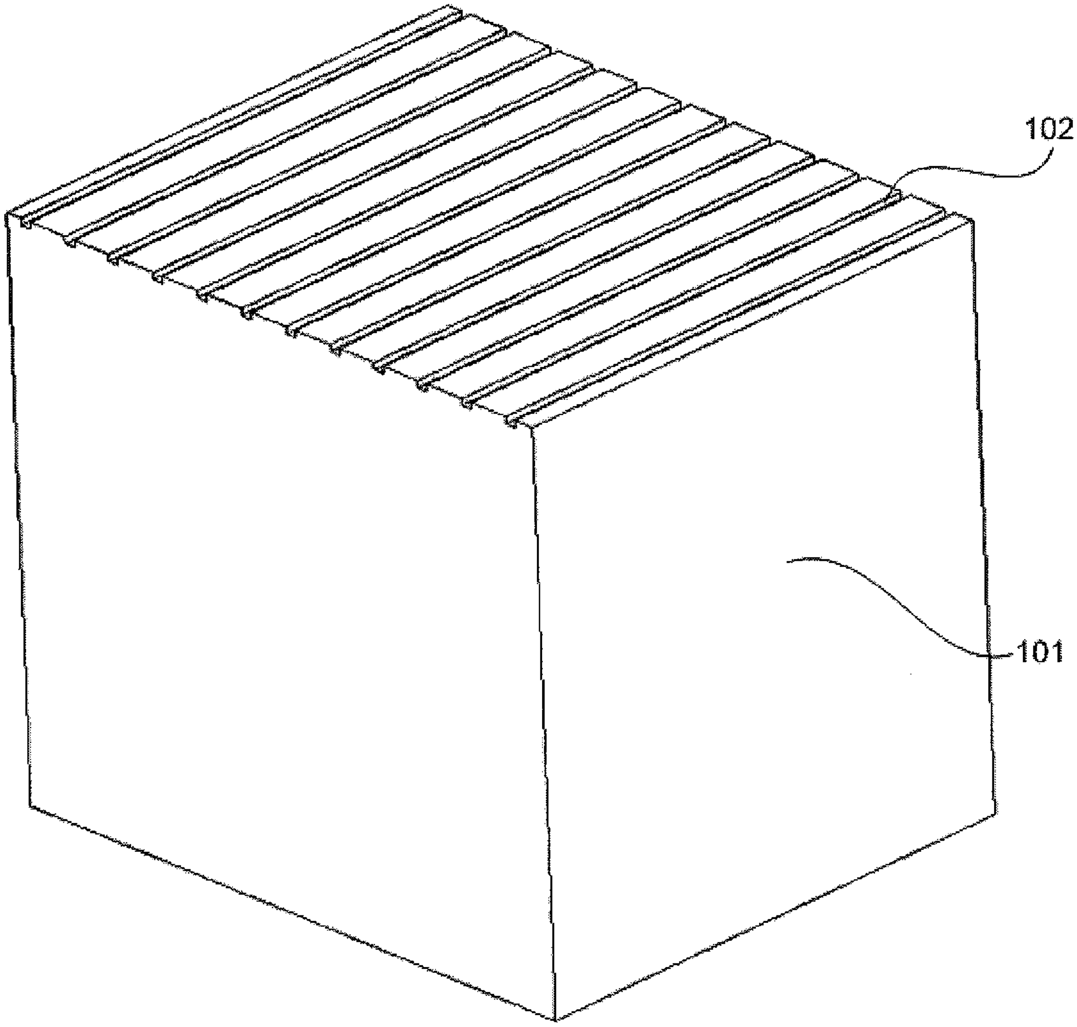
FIG. 1 is a perspective view illustrating the backing material of the exemplary transducer with the signal wire alignment kerfs cut in a comb pattern along the top surface.
Figure 2:
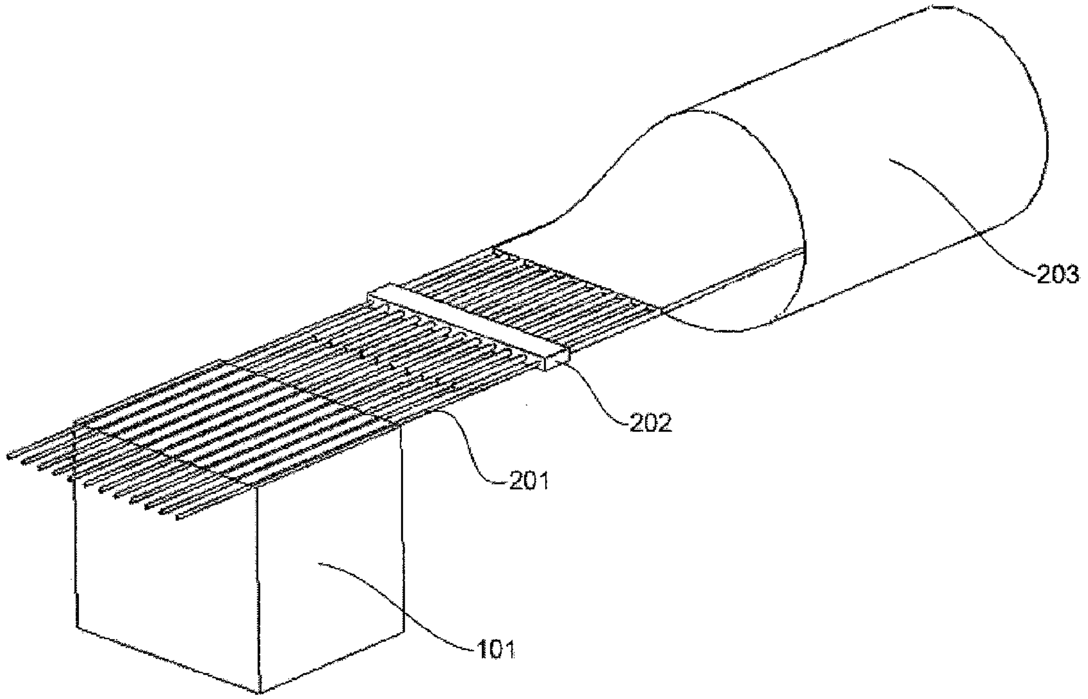
FIG. 2 is a perspective view illustrating the signal wires of the exemplary transducer exiting the transducer cable and disposed across the top surface of the backing material along the alignment kerfs.
Figure 3:
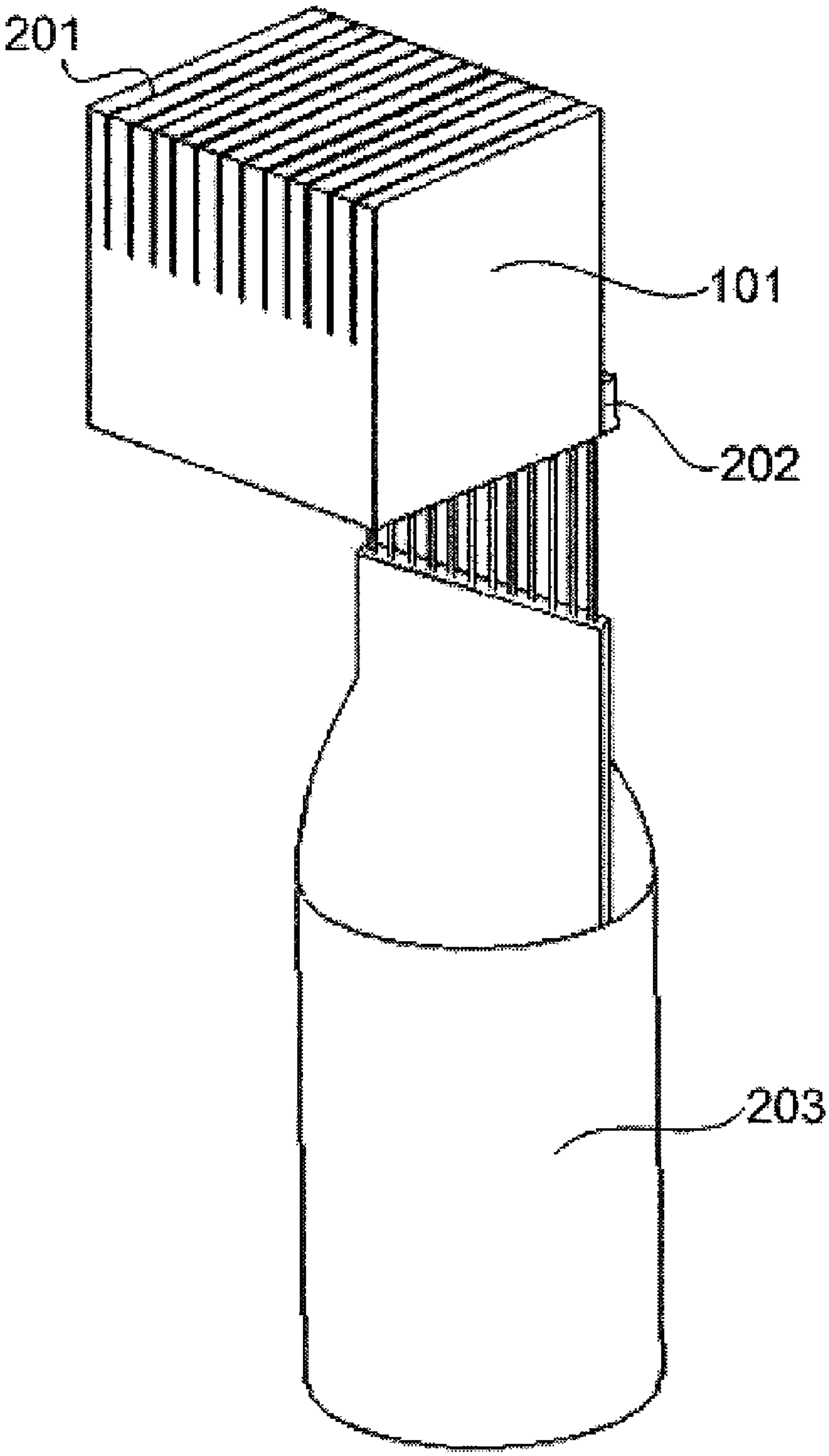
FIG. 3 is a perspective view illustrating the signal wires of the exemplary transducer stretched over the side of the backing material and prepared for bonding with the piezoelectric assembly.
Figure 4:
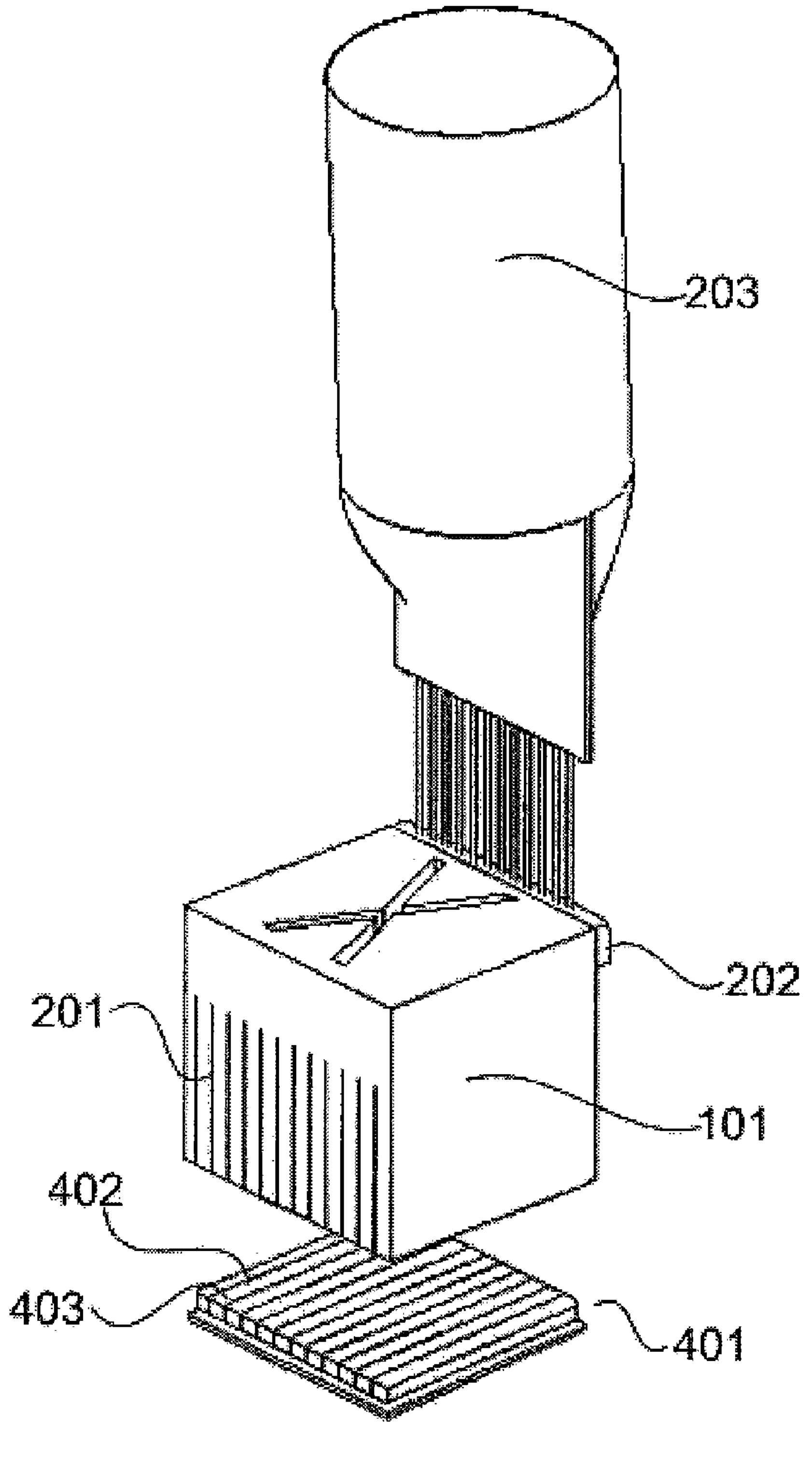
FIG. 4 is a perspective view illustrating the backing material of the exemplary transducer aligning with the piezoelectric assembly prior to compression bonding.

Referring to FIG. 1, a block of solid composite backing material 101 is scribed with a plurality of backing kerfs 102 at the element pitch. These backing kerfs 102 are precisely cut (using a dicing saw, for example) to align with the center of each piezoelectric element 403 in the piezoelectric assembly 401 (the piezoelectric assembly and its alignment with the backing material are illustrated in FIG. 4 and FIG. 5 and discussed in detail below). As shown in FIG. 2, bare signal wires 201 driven from the remote control circuitry exit the transducer cable 203, are held together through bus 202, and then disposed across the backing material 101 along the backing kerfs 102. Next, as shown in FIG. 3, the signal wires 201 are stretched over each side of the backing material 101 and secured, typically using a double sided adhesive.

FIG. 4 illustrates the alignment process of the backing material 101 with the piezoelectric assembly 401. It should be noted that the construction of the piezoelectric assembly 401 is not specific to the present disclosure. However, a typical method for construction of this layer is described as follows for reference. The piezoelectric assembly 401 is typically comprised of a layer of piezoelectric material, disposed on at least one acoustic matching layer, and an electrical grounding layer. Element kerfs 402 are cut through the piezoelectric layer and matching layers, leaving the grounding layer intact, to form the individual transducer elements 403. In this way a plurality of acoustically isolated transducer elements is created and made ready for construction into an array transducer assembly.

Figure 5A:
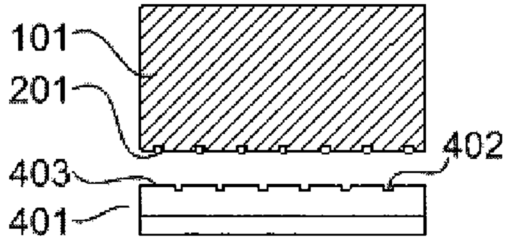
FIGS. 5A-5C are cross-sectional views illustrating the alignment and bonding process of the backing material to the piezoelectric assembly.
Figure 5B:
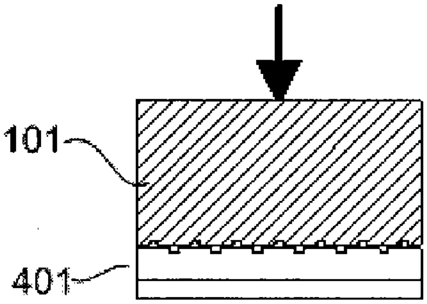

Referring again to FIG. 4, with the signal wires 201 aligned in the backing kerfs 102 (not visible in FIG. 4, refer to FIG. 1) and secured against the backing material 101, the backing material is aligned with the piezoelectric assembly 401. The piezoelectric assembly 401 is positioned so that the center of each of the individual elements 402 aligns with one of the signal wires 201. The signal wires 201 are highly flexible and constructed from round conductors, although other geometries may be used. This will result in each of the signal wires 201 making electrical contact along the length of each of the piezoelectric elements 403 while minimizing the electrical contact area and thereby maximizing acoustic performance. FIG. 5A and FIG. 5B illustrate this alignment process in greater detail using a cross-sectional view to better demonstrate the alignment of the signal wires 201 and the piezoelectric elements 403.

Figure 5C:
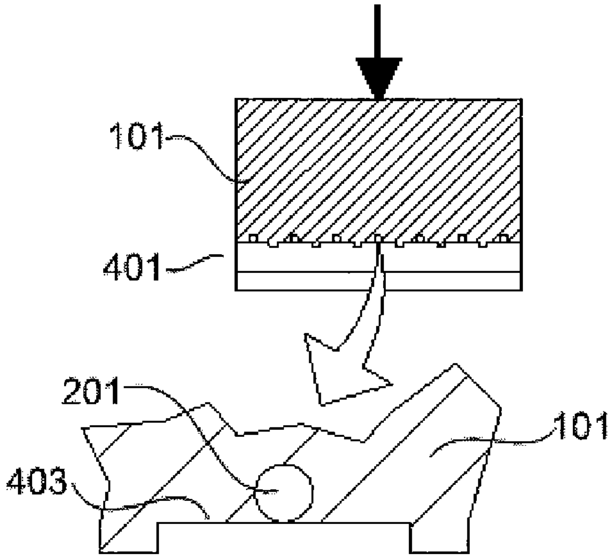
Figure 6:
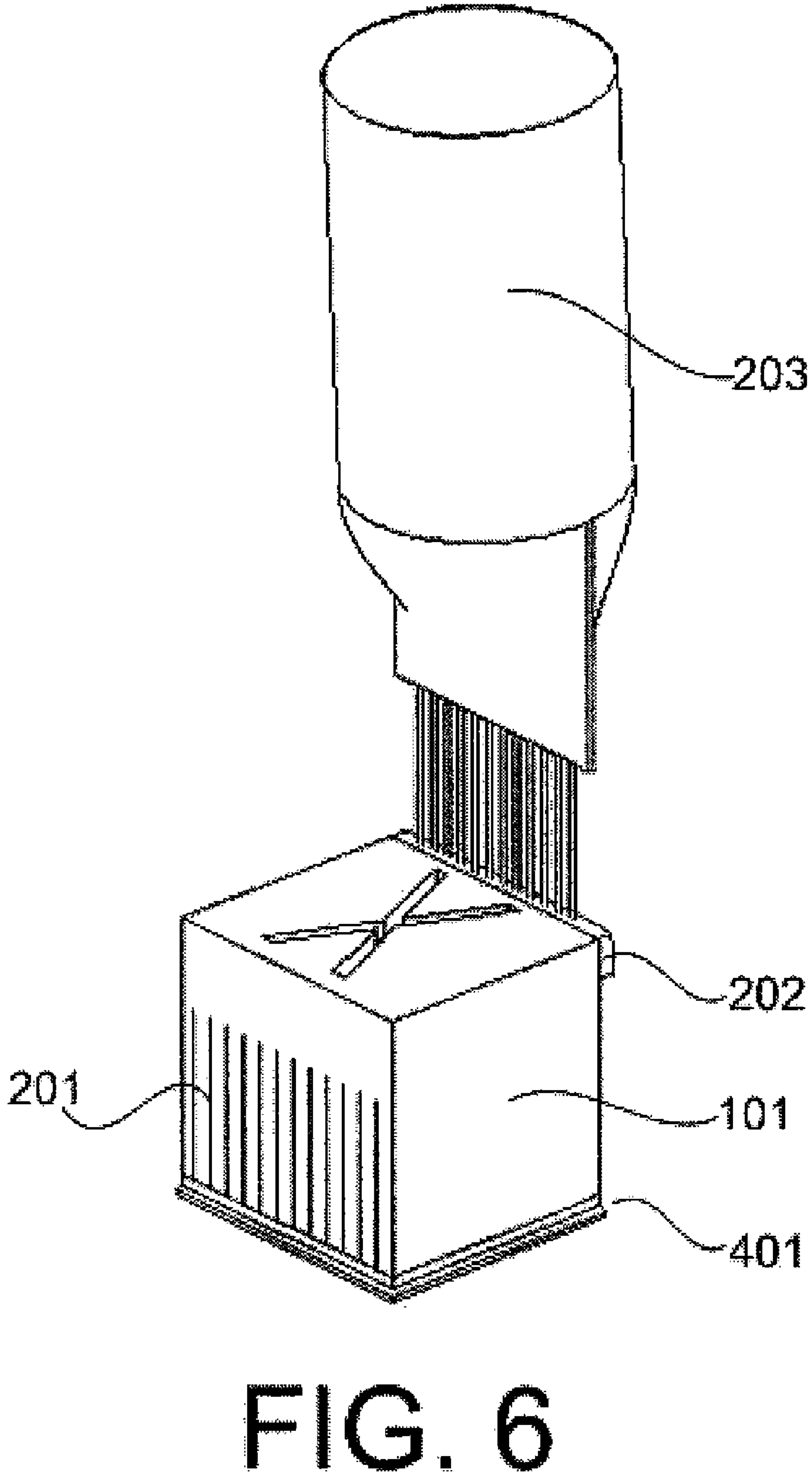
FIG. 6 is a perspective view illustrating the exemplary transducer fully assembled (without packaging)

Referring to FIG. 6, the piezoelectric assembly 401 and the backing material 101 are clamped together and bonded using a thin layer of adhesive, compressing the signal wires 201 between them. An electrical test is performed to ensure each of the transducer elements 403 is electrically connected to each signal wire 201. The entire assembly is compression bonded together, and excess signal wires 201 trimmed. As illustrated in FIG. 5C, under the temperature and pressure of the compression bonding process, the backing material 101 will flow slightly and encapsulate the signal wires 201, sealing them against the individual transducer elements 403. Using the methods of the present disclosure, the signal wires 201 contact the piezoelectric elements 403 across the length of each element while still minimizing the contact area, thus maximizing acoustic performance. It should be noted that the temperatures used in the compression bonding process are significantly less than the temperatures seen by the piezoelectric elements 403 when making solder connections to or relatively near the elements, as is the case in prior art methods.

Although the array transducer described in the preferred embodiment includes rectangular elements of uniform size and shape arranged in a rectangular array, the disclosure is not limited in this regard. In accordance with the teachings of this disclosure, the transducer array can include transducer elements of any desired shapes including, but not limited to, circular, elliptical, triangular, and curved elements. Likewise, the array itself can be fabricated in any desired shape, such as circular, elliptical, triangular, curved, etc, and be comprised of similar or dissimilar elements.

The exemplary array transducer disclosed in the preferred embodiment is a linear 1D array. However, the inventors also contemplate five alternate embodiments: one for a 1.5D array; another for a 2D array; a third for a flexible array transducer, which would prove useful for measuring irregular surfaces; a fourth for a plurality of linear arrays (as described in the preferred embodiment) built adjacent to each other on a single piezoelectric layer as a method to form a 1.5D or 2D array; and a fifth for an eddy current array probe.

Figure 7:
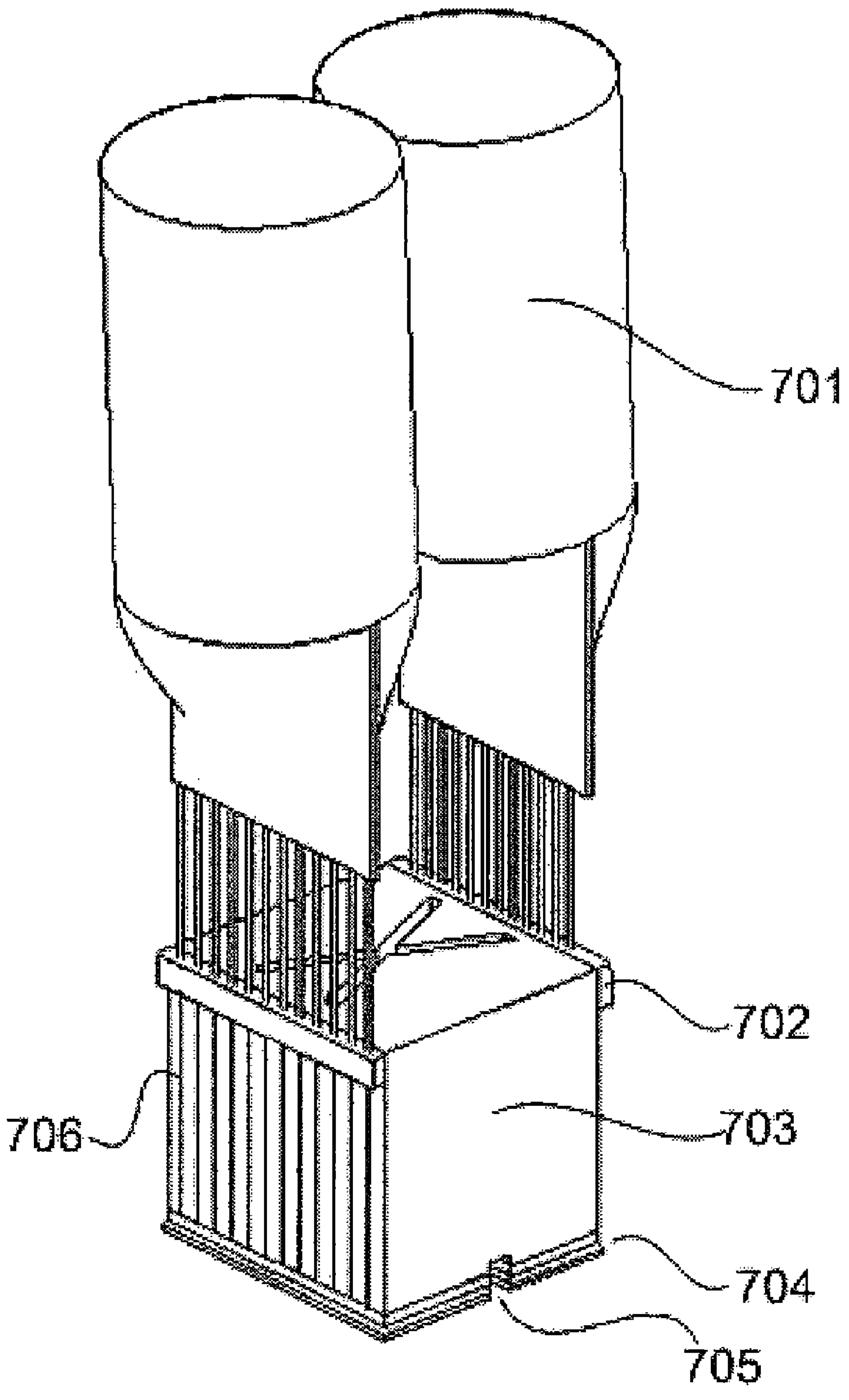
FIG. 7 is a perspective view illustrating an alternate embodiment of the present disclosure, resulting in a 1.5D array transducer.

FIG. 7 illustrates the first of these alternate embodiments, which creates a 1.5D array transducer. This embodiment follows the same procedure as the preferred embodiment disclosed above, but with two differences. In this embodiment, the transducer cable 701 is opened at its midpoint to expose the signal wires 706. As in the preferred embodiment, the exposed signal wires 706 are disposed across the backing material 703 along the backing kerfs (not visible in FIG. 7). After the compression bonding process is complete, a cross kerf 705 is cut through piezoelectric layer 704, perpendicular to the signal wires 706. This cross kerf 705 severs the signal wires 706 and creates two separate transducer arrays, with each transducer element electrically connected to a separate signal wire 706, and with each array bussed into a separate transducer cable 701.

Figure 8A:
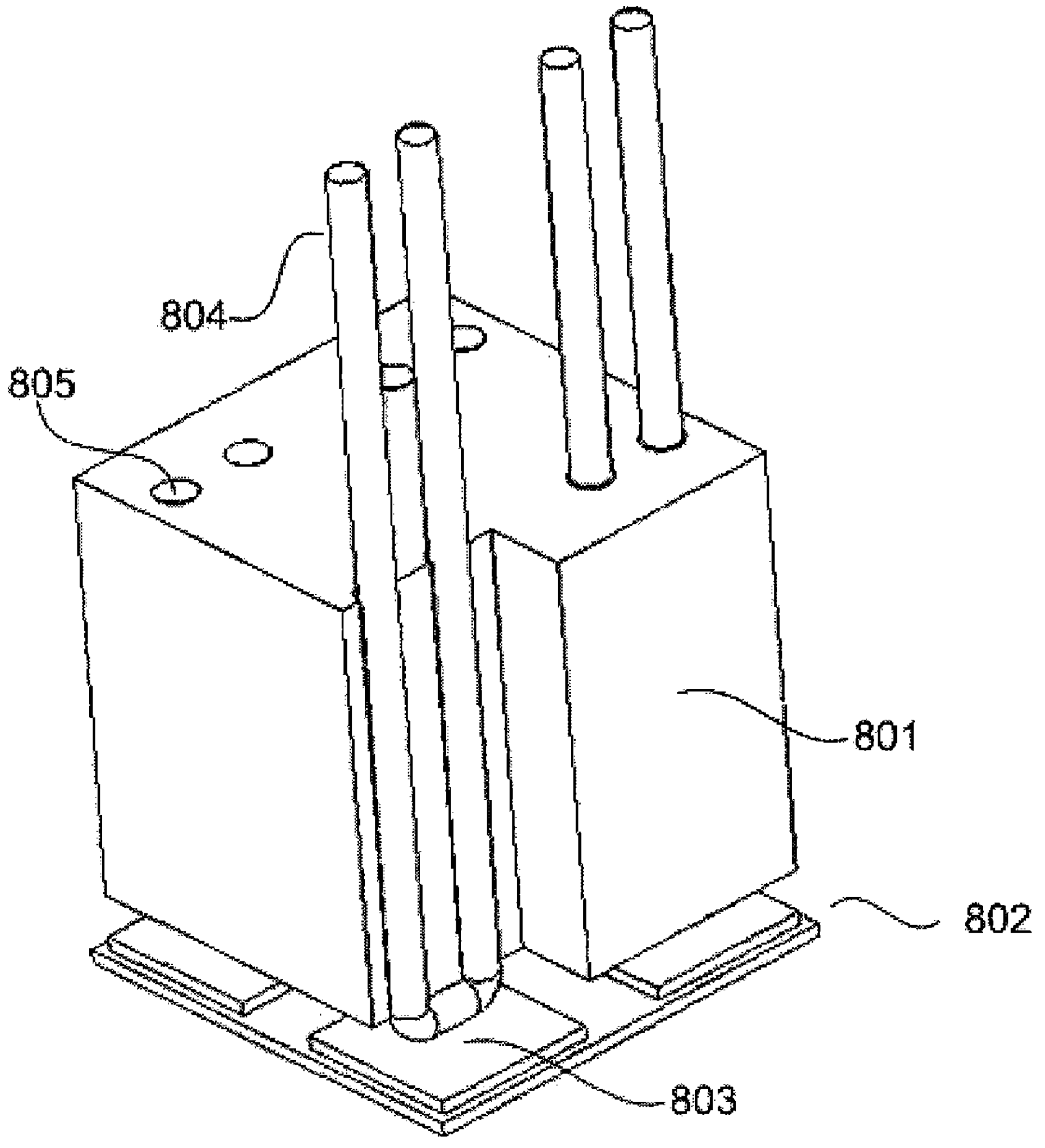
FIG. 8A-8B are a perspective views illustrating an alternate embodiment of the present disclosure, resulting in a 2D array transducer.
Figure 8B:
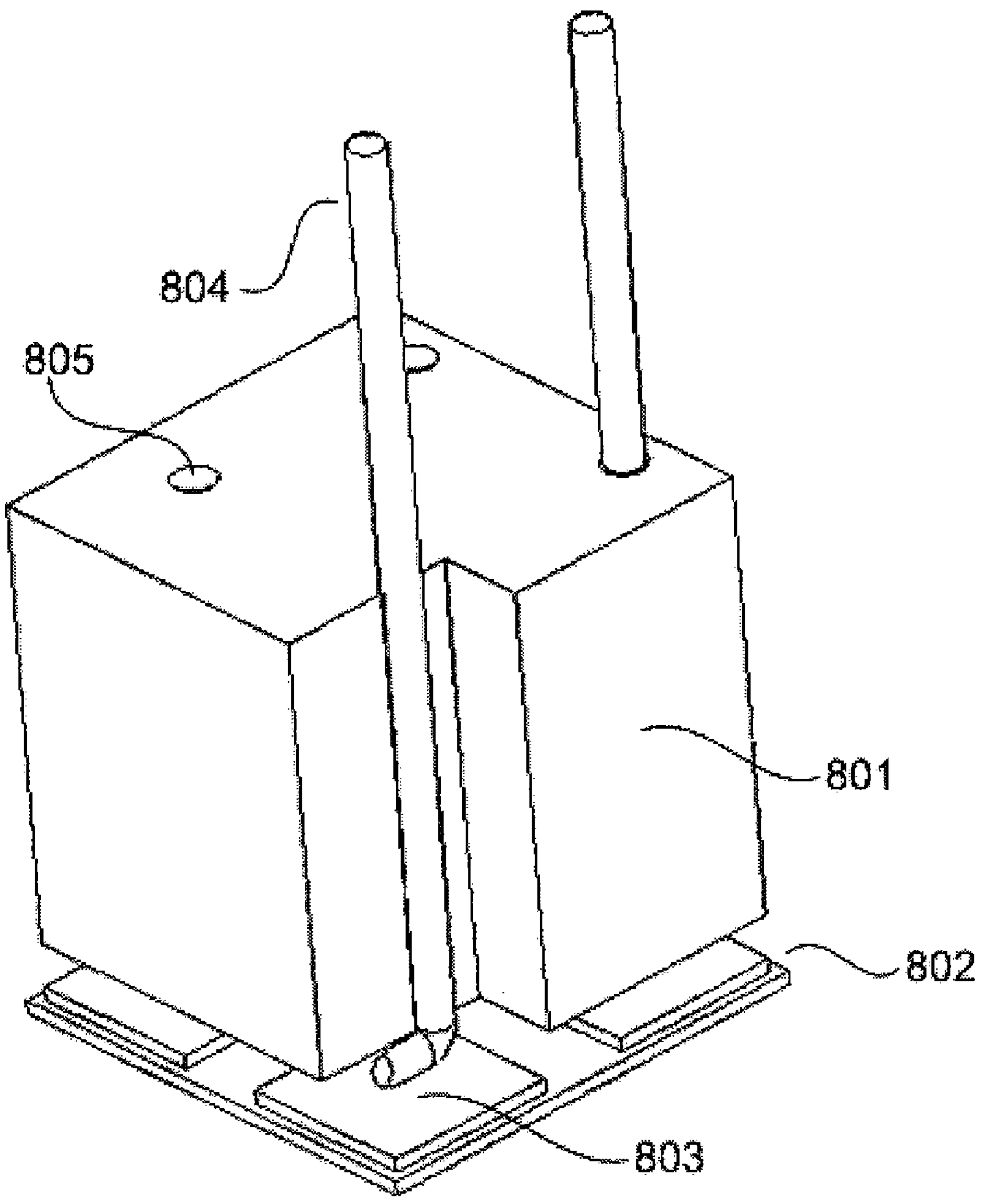

FIGS. 8A and 8B illustrate the second alternate embodiment, which creates a 2D array transducer. Orthogonal to the plane of the piezoelectric element array 802, holes 805 are made through the backing material 801, precisely aligning with each transducer element 803 and creating z-axis paths completely through the backing material 801, wide enough to permit the signal wires 804. As in the preferred embodiment, backing kerfs may be used to help align and secure the signal wires 804 but are not required, as the holes 805 through the backing material will serve to align and secure the signal wires through the bonding process. At least one hole 805 is made for each piezoelectric element 803 in the array. FIG. 8A illustrates a method in which a pair of holes is made for each piezoelectric element 803. In this instance, a signal wire 804 is fed through the first hole 805 of a pair, disposed across the backing material 801, and then fed back down through the second hole 805 of a pair. FIG. 8B illustrates a method in which only one hole is made for each piezoelectric element 803. In this instance, the free end of the signal wire 804 is kept short enough to ensure it cannot reach any of the adjacent piezoelectric elements 803. Using either method, or variations thereof, each piezoelectric element will be centered and bonded against an electrically isolated signal wire 804 when the compression bonding process is complete. Once all signal wires 804 have been routed and aligned on the mating surface of the backing material 801, the piezoelectric layer 802 is aligned and compression bonded to the backing material, as described in the preferred embodiment.

Figure 9:
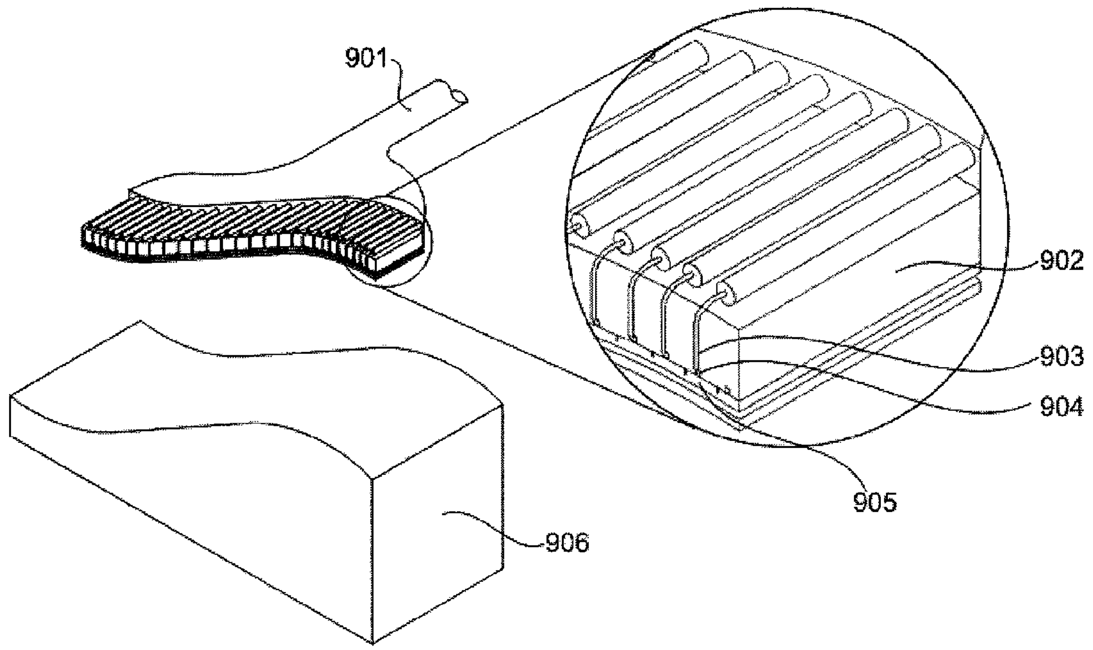
FIG. 9 is a perspective view illustrating an alternate embodiment of the present disclosure, resulting in a flexible 1D array transducer.

FIG. 9 illustrates the third alternate embodiment, resulting in a flexible array transducer. This embodiment follows the same procedure as the preferred embodiment described above but with the exception that a thin, flexible backing material 902 is used. This type of backing will allow the array transducer to conform to irregular surfaces, such as the curved test piece 906 shown in FIG. 9. As in the preferred embodiment, backing kerfs 904 are made in the backing material 902. Flexible, round signal wires 903 are disposed across the backing material 901 along the backing kerfs 904, and the backing material 901 is then bonded under compression to the piezoelectric elements 905. The connection method of the present disclosure is well suited for this type of transducer assembly. An intermediate board or flex circuit inserted behind the backing material 902 would inevitably add to the thickness and complexity of the array, making it less likely to conform to irregular surfaces, more expensive, and potentially less reliable. The methods of the present disclosure, however, minimize the thickness of the transducer assembly and facilitate this type of design.

Figure 10:
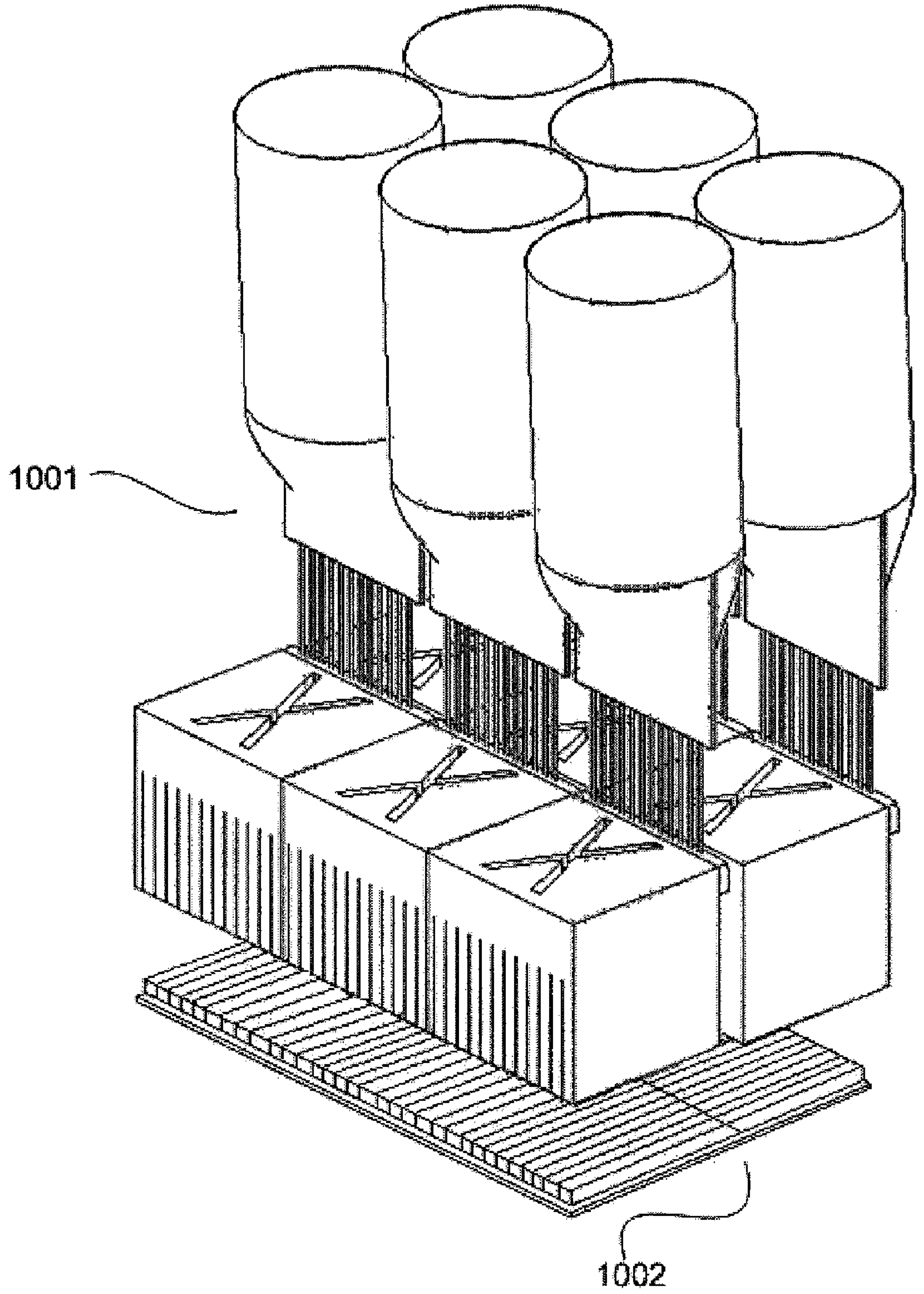
FIG. 10 is a perspective view illustrating an alternate embodiment of the present disclosure, resulting in multidimensional array transducer.

FIG. 10 illustrates the fourth alternate embodiment, resulting in a multidimensional N×M array transducer. The methods of the preferred embodiment are duplicated a number of times to produce a plurality of wired backing assemblies 1001. As is detailed in the description of the preferred embodiment, these backing assemblies 1001 are each comprised of a block of solid backing material scribed with a plurality of backing kerfs with bussed signal wires aligned by said backing kerfs. These backing assemblies 1001 are arranged in an N×M array and aligned with and then compression bonded to the piezoelectric assembly 1002. In this way a plurality of transducer elements can be arranged in a two dimensional array.

Figure 11:
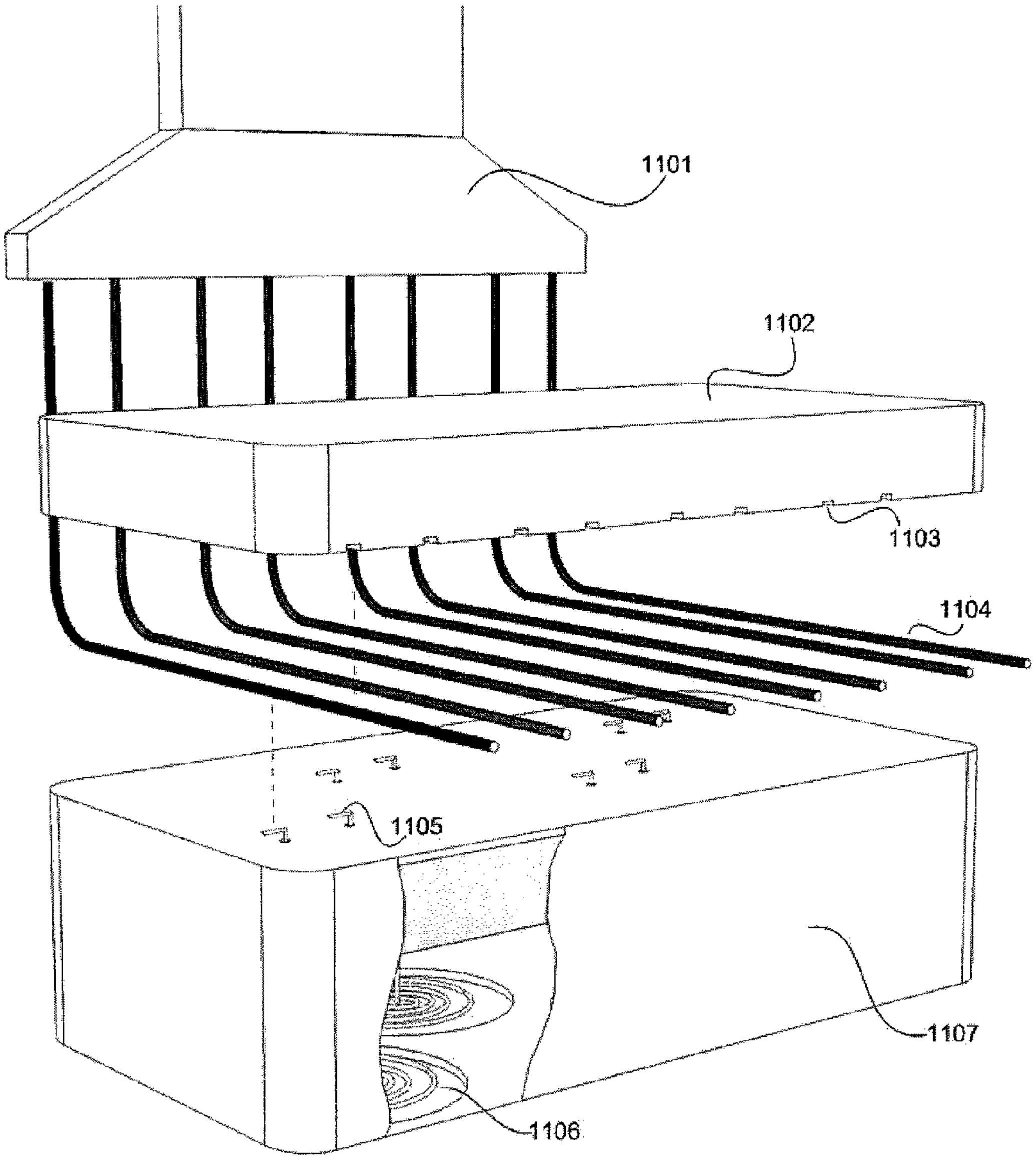
FIG. 11 is a perspective view illustrating an alternate embodiment of the present disclosure, resulting in an eddy current array probe.

FIG. 11 illustrates the fifth alternate embodiment, resulting in an eddy current array probe. As in the preferred embodiment, a plurality of kerfs 1103 are precisely cut into a solid backing material 1102 to align with the exposed element contacts 1105. A plurality of signal wires 1104 exit the probe cable 1101 and are disposed across the backing material 1102 along the backing kerfs 1103. The backing material 1102 is then bonded under compression to the eddy current coil assembly 1107.

Although the present disclosure has been described in relation to particular embodiments thereof, many other variations and modifications and other uses will become apparent to those skilled in the art. It is preferred, therefore, that the present disclosure be limited not by the specific disclosure herein, but only by the appended claims.

What is claimed is:

1. An array transducer, comprising:

transducer elements disposed on the surface of a piezoelectric assembly;

a backing material having a mating surface;

signal wires protruding from a signal cable and disposed on the mating surface; and wherein the backing material with the disposed signal wires are matingly secured to the transducer elements by adhering and/or clamping the piezoelectric assembly and the backing material against one another in a manner which secures the signal wires electrically against the transducer elements and causes the signal wires to become partly encapsulated by the backing material without impacting adversely the acoustic performance of the transducer elements and to achieve direct connection between the signal cable and the transducer elements.

2. The array transducer of claim 1, further including kerfs formed in the mating surface of the backing material at locations on the backing material which align with corresponding transducer elements.

3. The array transducer of claim 2, the backing material further including a side surface and the signal wires being stretched over the side surface of the material and being secured thereat.

4. The array transducer of claim 2, wherein the array transducer is formed in a shape selected from a shape group consisting of rectangular, circular, elliptical, triangular, and curved shapes.

5. The array transducer of claim 2, wherein the transducer elements are formed as an array of transducer elements wherein the array has a shape selected from the shape group consisting of: 1D, 1.5D, 2D, and multidimensional shapes.

6. The array transducer of claim 2, wherein the array transducer is formed in a form that is flexible and which enables the array transducer to be conformed to a surface shape of an object to be tested.

7. The array transducer of claim 2, wherein the array transducer is formed as a 1.5D device by forming a cross cut in the transducer elements, after the signal wires and the backing material have been secured to each other.

8. The array transducer of claim 1, wherein the array transducer is formed as a 2D transducer and including holes in the backing material which reach the mating surface and including signal wires passing through the holes.

9. The array transducer of claim 2, wherein the array transducer is formed as an NxM array transducer.

10. The array transducer of claim 1, wherein the array transducer is configured as an eddy current array probe.

* * * * *